United States Patent [19]

Venambre et al.

[11] Patent Number: 5,283,423
[45] Date of Patent: Feb. 1, 1994

[54] CONTACTLESS MICROCIRCUIT CARD

[75] Inventors: Jacques Venambre, Ifs Plaine; Henri Molko, La Queue les Yvelines, both of France

[73] Assignee: U.S. Philips Corporation, New York, N.Y.

[21] Appl. No.: 840,368

[22] Filed: Feb. 24, 1992

[30] Foreign Application Priority Data

Mar. 15, 1991 [FR] France .................. 91 03197

[51] Int. Cl.⁵ .................. G06K 7/08; G06K 19/07
[52] U.S. Cl. .................. 235/492; 235/449
[58] Field of Search .......... 257/679; 235/492, 449; 174/254; 361/398

[56] References Cited

U.S. PATENT DOCUMENTS

| | | | |
|---|---|---|---|
| 4,605,844 | 8/1986 | Haggan | 235/492 |
| 4,650,981 | 3/1987 | Foletta | 235/492 |
| 4,701,236 | 10/1987 | Vieilledent | 156/252 |
| 4,791,285 | 12/1988 | Ohki | 235/492 |
| 4,822,989 | 4/1989 | Miyamoto et al. | 235/492 |
| 4,910,582 | 3/1990 | Miyamoto et al. | 357/74 |
| 4,931,991 | 6/1990 | Cvijanovich | 235/492 |
| 4,960,983 | 10/1990 | Inoue | 235/449 |
| 4,999,742 | 3/1991 | Stampfi | 361/400 |

FOREIGN PATENT DOCUMENTS

| | | | |
|---|---|---|---|
| 249356 | 12/1987 | European Pat. Off. | 235/449 |
| 2580416 | 4/1985 | France . | |
| 2617668 | 7/1987 | France . | |
| 9005917 | 11/1990 | France . | |

Primary Examiner—John Shepperd
Attorney, Agent, or Firm—Steven R. Biren

[57] ABSTRACT

The invention relates to a microcircuit card having a card support with a cavity in which a cover foil (200) is fixed, which foil (200) includes a circuit support (20) and at least one circuit (210) arranged on an inner surface of the circuit support (20) facing towards the interior of the cavity, the circuit (210) being arranged opposite a first portion of a bottom of the cavity. The circuit support (20) includes on its lower surface at least one energy transfer element (220) arranged opposite a second portion of the bottom of the cavity at a distance from the first portion.

7 Claims, 2 Drawing Sheets

CONTACTLESS MICROCIRCUIT CARD

BACKGROUND OF THE INVENTION

The invention relates to a microcircuit card comprising a card support which has a cavity in which a cover foil is fixed, which foil has a circuit support and at least one circuit (generally, an integrated circuit) arranged on a lower surface of the circuit support facing towards the interior of the cavity, the circuit being provided opposite a first portion of a bottom of the cavity.

Such microcircuit cards of the type which has electrical contacts, known from French Patent Application FR-A-2 617 668 filed on Mar. 7, 1987, are suitable for use in various applications (registration of personal data, bank transactions, payments, etc.) and are provided for this purpose to various categories of users.

Also known are contactless microcircuit cards (for example, from French Patent Application no. 2 621 147, published Mar. 31, 1989, corresponding to U.S. Pat. No. 4,960,983). According to this prior document, a card of known type (FIGS. 7 and 8) comprises a microcircuit and electromagnetic coils acting as energy transfer elements which are mounted on a printed circuit. The microcircuit chip and the electromagnetic coils are enclosed together with the printed circuit board in a protective casing or card body made of a dielectric resin or similar material. The manufacture of such a product is expensive.

SUMMARY OF THE INVENTION

The present invention has for its object to realize a microcircuit card of the contactless type by the cited technology with the use of a cover foil which is known from microcircuit cards with contacts.

For this purpose, a microcircuit card is characterized in that the circuit support comprises on its lower surface at least one energy transfer element arranged opposite a second portion of the bottom of the cavity remote from the said first portion.

As a result, the energy transfer element is mechanically and electronically protected by the circuit support.

According to a preferred embodiment, the circuit support is a flexible printed circuit with the energy transfer element patterned thereon.

In that way, the circuit support and the energy transfer element are capable of following the displacements of the card support when mechanical stresses are exerted on the latter.

At least one energy transfer element may be a coil. Preferably, the said second portion is arranged close to a lateral edge of the cavity.

At least one part of the second portion of the bottom of the cavity may have an increased thickness, preferably in such a way that the energy transfer element is practically in contact therewith.

In this connection the French Patent Application no. 90 05917 filed on May 11, 1990 proposes to improve the mechanical conditions as regards the transfer of stresses to the microcircuit, especially during mechanical deformation of the card, and thus to increase the reliability of the card. Such a card may also be realized in accordance with the present invention in such a manner that it incorporates this improvement. The bottom then comprises at least one thinned part situated at least substantially outside the first portion. Such a thinned part forms a center of deformations, while the part of the cavity bottom situated opposite the circuit forms a pillar, which assembly leads to a reduction in the stresses to which the circuit is subjected.

BRIEF DESCRIPTION OF THE DRAWING

The invention will be detailed in the following description, given by way of non-limitative example, with reference to the annexed drawing in which.

DESCRIPTION OF THE PREFERRED EMBODIMENTS

Figure 1:
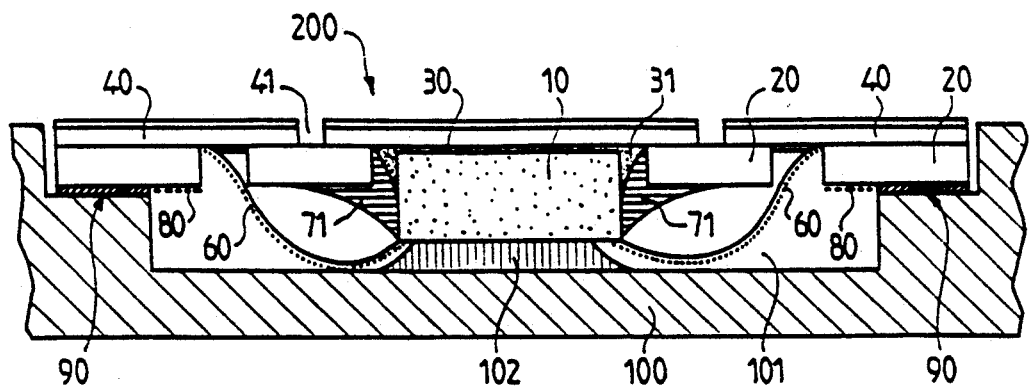
FIG. 1 shows an electronic card according to the prior art.

In FIG. 1, a microcircuit card comprising a cover foil 200 with a circuit support (20, 40) and a circuit 10 is fixed in a cavity 101, the circuit 10 being arranged on an interior surface of the circuit support (20, 40) in such a way that the circuit 10 is inside the cavity 101 and faces the bottom 100 of the cavity 101. The circuit 10 is glued in usual manner on the circuit support (20, 40) with a conducting glue (30, 31), and connection wires 60 are soldered between the circuit 10 and the circuit support (20, 40), the latter having conductive layers which are arranged so as to achieve the necessary connections. The circuit support here comprises a conductive layer 40 in the form of a copper foil on which a layer of Ni, then a layer of Au, and an insulating layer 20 have been electrolytically deposited, which assembly forms a flexible support. The layer 40 has openings 41 which separate it electrically into different zones, thus rendering it possible to insulate the electrical contact points. Connection wires 60 are put into position ultrasonically between the upper surface of the chip 10 and the said zones. Zones 71 of epoxy resin having a sloping profile may be provided to reinforce the mechanical strength. A more detailed description of this assembly will be found in the French Patent Application FR 2 580 416 filed on Dec. 4, 1985.

The cover foil, which is obtained after cutting out, is returned and glued into the cavity 101 at 90. At 90, a double-sided peelable adhesive may be used in accordance with the Patent Application FR 2 580 416 referred to above, which peelable layer may serve as a mask for a protective varnish 80.

Finally, gluing is achieved at 102 by means of a layer of comparatively hard polyurethane resin so as to obtain a good mechanical rigidity of the assembly. Such a resin is, for example, DAMIVAL 13521 manufactured by ALSTHOM which has a nominal hardness of 85 SHORE D2 after polymerization. The resins of the DAMIVAL family are considered rigid by the manufacturer for a hardness of 90 SHORE D2, semi-rigid for a hardness of 85 SHORE D2 (as above), and flexible for a hardness of 50 SHORE D2.

Figure 2A:
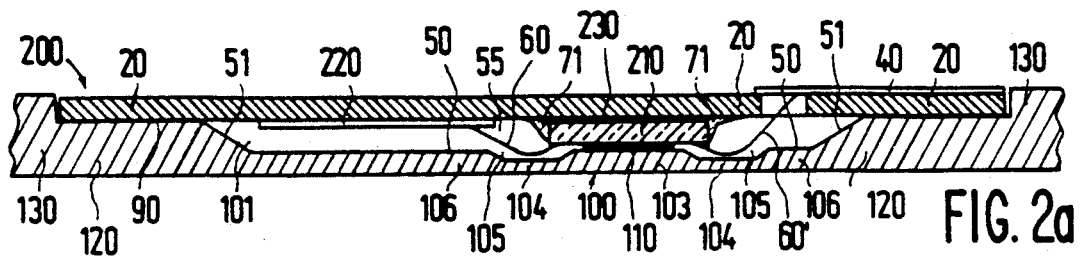
FIGS. 2a and 2b show in longitudinal section a card and a card support according to the invention, respectively, the latter in a preferred embodiment.
Figure 2B:
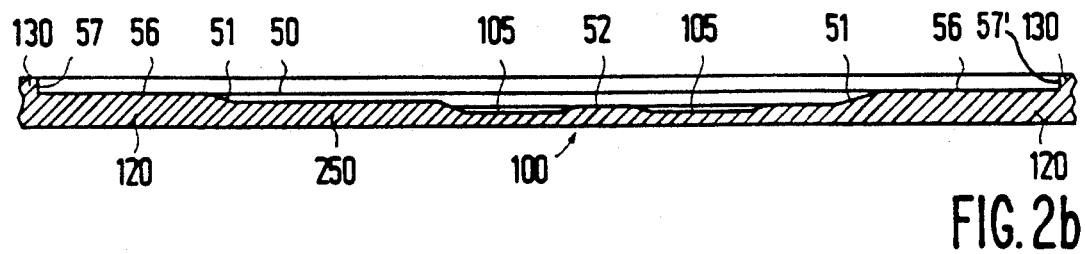

In FIGS. 2a and 2b, the soldered wires 60 form electrical contacts between the circuit 210 glued at 230 to the inner surface of a printed circuit 20, especially a flexible one, and a coil 220 patterned on the printed circuit 20. A contact 40 is shown on the upper surface of the printed circuit by way of possible option, but it should be appreciated that it is more customary to metallize the printed circuit on its inner surface only. The double-sided adhesive 90 may be used, but the remaining steps of the assembling process are much simpler.

According to an embodiment corresponding to the Application no. 90 05917 referred to above, the inner surface 50 of the bottom 100 of the cavity 101 of a card support 130 is grooved at 105, here with two grooves situated mainly on either side of the circuit 10 and defining two thinned regions 104, while a thicker part 103 is left, facing a major part of the circuit 10.

A sloping edge 51 is visible between the bottom 56 of the outer contour joint 57 where the glue connection 90 is realized between the cover foil 200 and the cavity 101 itself. A sloping edge 51 forms the outer limit of the cavity 101 and forms a transition between an external part 106 of the bottom 100 and the region 120 of the card support 130 where the joint is formed. A resilient layer 110 may be provided between the circuit 10 and the inner surface 51 of the central part 103 of the bottom 100 of the cavity 101. Its function will be explained below. It will also be seen that the presence of the grooves 105 is utilized for accommodating at least in part the excess thickness of the wires 60 and 60' in relation to the circuit 10 in the vicinity of the wire solder point at 61 on the main surface of the circuit 10 facing the bottom 100. This renders possible a space saving in the device. As a result, the central part 103 is narrower than the portion of the bottom 100 which faces the circuit 10 (ar. thus than the circuit 10) to enable the wire (60, 60') in the vicinity of the wire solder point 61 to have clearance.

In FIG. 2b, the bottom 100 has a thicker region 250 which is situated substantially opposite the coil 220 and which is preferably practically in mechanical contact therewith (subject to tolerances).

Figure 5:
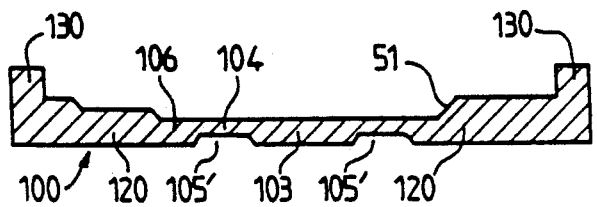
FIGS. 5 and 6 show modifications of the cavity.
Figure 6:
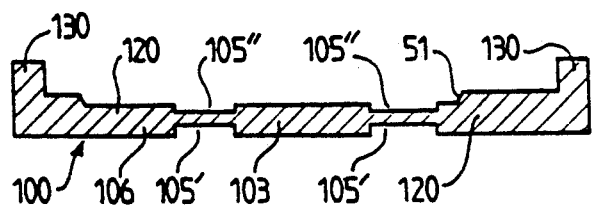

FIGS. 5 and 6 show two alternative embodiments. Grooves 105' may be provided on the surface of the card support opposite to the cavity 101 (FIG. 5), or grooves 105' and 105" may alternatively be provided simultaneously on the inner surface of the cavity 101 and on the surface of the card support opposite to the cavity 101 (FIG. 6). The grooves may also be omitted, as are then the thinned parts 104.

With special reference to FIGS. 3a and 3b, the influence of the thinned parts 104 and of the thicker region 250 will now be explained, when a card is bent, which parts and region may be provided together or separately, or which may alternatively be omitted.

Figure 3A:
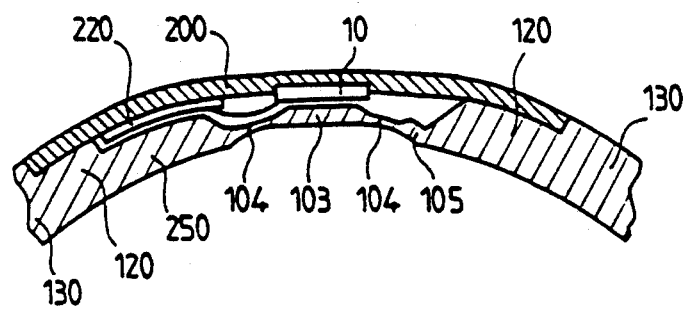
FIGS. 3a and 3b illustrate the deformation effects of a card having a card support according to FIG. 2b.

In FIG. 3a, the cover foil 200 is stretched out and the inner surface 52 of the bottom 50 tends to be pressed against the circuit 10. The thinned parts 104 become folded and thus absorb a major portion of the deformations, which results in that the part 103 either does not press against the circuit at all, or, in the case of a strong bending of the card, does press against the circuit 10 but transmits thereto only a fraction of the stresses, the result being that the reliability of the card during repeated bending operations is increased. In the case shown in FIG. 3a, the function of the thinned parts 104 is to form a focal point for the deformations to avoid that the central part 103 transmits too high stresses to the circuit 10. If the excess thickness 250 is present, this will protect the coil 220 when the cover foil 200 is stretched out, since the latter follows the contour of the excess thickness 250.

Figure 3B:
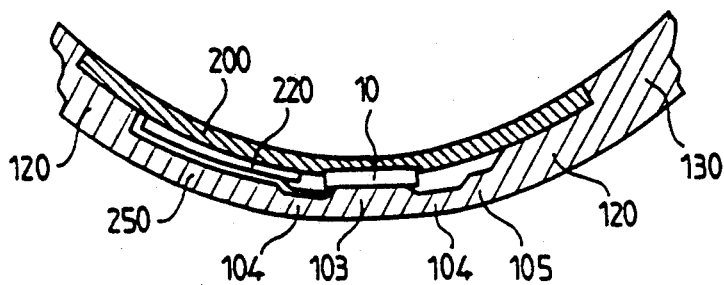

In FIG. 3b, the cover foil 200 is under compression and the circuit 10 will press itself against the central part 103 which forms a pillar (or a girder) which makes a translatory movement owing to the thinned parts 104. As a result, the stresses suffered by the circuit 10 are diminished, while the deformations of the bottom 50 of the cavity 101 remain within reasonable limits. The pillar function of the part 103 renders possible in particular a greater contact surface between it and the circuit 10, since the deformations are substantially suffered by the thinned parts 104 whereas the part 103 remains comparatively plane. In practice, the central part 103 will be given a maximum thickness which is compatible with the thickness tolerances allowed for the card and will be given a surface area equal to that of the circuit 10, apart from a possible passage space for the wires 60. It is essential to realize the thinned parts 104 with the greatest possible width and the smallest possible thickness which are compatible with repeated bending tests. If the region of increased thickness 250 exists, it will protect the coil 220 when the cover foil 200 is under compression, since in that case it also follows the contour of the region of increased thickness 250.

EXAMPLE

A credit card of polyvinylchloride (PVC) charged with $TiO_2$ according to the ISO standard having a nominal length of 85.6 mm, a nominal width of 53.98 mm, and a nominal thickness of 810 microns, has a cavity with a total diameter from sidewall 57 to sidewall 57'; of approximately 16.2 mm, the diameter across the edge of the slope 51 being 12 mm.

The bottom 50 of the cavity 101 has a thickness of 300 microns, the thinned parts 104 have a thickness of 200 microns, a length of 3.5 mm and a width of 2.5 mm, while the pillar 103 has a width of 2.5 mm. There is a nominal tolerance of 50 microns between the circuit 10 and the central part 103. The printed circuit 20 has a thickness of 125 microns and the coil(s) 220 is (are) realized from a conductor of approximately 70 microns thickness. The region of increased thickness 250 may have a thickness of up to approximately 550 microns.

The resilient layer 110, if present, may be made from silicone resin RTV 3140 manufactured by DOW CORNING with a hardness of 20 to 30 SHORE D2, depending on the vulcanization conditions, especially as regards hygrometry. According to the evaluation criteria used above for the resins, the RTV 3140 may be qualified as "very flexible". It renders it possible to obtain a dynamic damping of the stresses transmitted between the card 10 and the central part 103 of the bottom 50, thus complementing the effect of the thinned parts 104. The resilient layer 110 must not be too deformable so that it can fulfil its damping function, but it must be sufficiently deformable to avoid a rigidification of the assembly which would favor the transmission of stresses to the microcircuit. The optimum resilience of the layer 110 can be determined by means of bending tests.

Such a card, preferably including a resilient layer 110, has good properties for magnetic reading of magnetic tracks which partly overlap the cavity 101. In that case, the central part 103 forms a pillar whose rigidity renders it possible to avoid excessive deformations which would lead to excessive attenuation (or "drop out") of the signal. Since there is no rigid layer 102, the deformations of the cover foil which could possibly be induced by a roller rolling over it during a magnetic read/write action are transmitted to the pillar 10 only in as far as they exceed a certain threshold. It is particularly recommended to leave the smallest possible tolerance between the circuit 10 and the central part 103 so that the latter may be as thick as possible and thus as stiff as possible, which is also favorable in the case of bending operations illustrated in FIGS. 3a and 3b.

Other embodiments may be realized. The circuit 10 need not necessarily be provided at the center of the cavity 101, which cavity may have shapes other than circular. A cavity 101 may comprise only one thinned part 104, particularly if the circuit 10 adjoins an edge of the cavity. The grooves 105, 105' and 105", if present, could be realized, for example, by grinding.

Figure 4A:
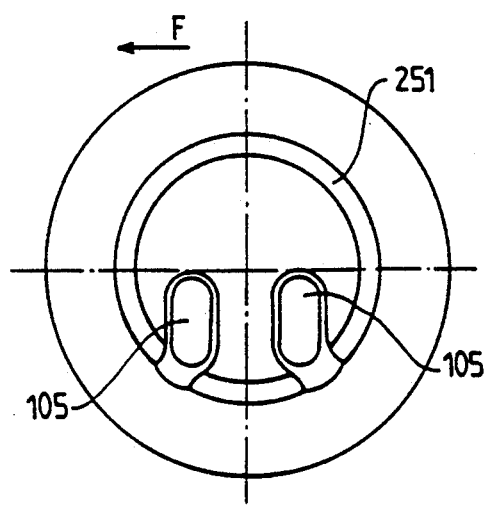
FIGS. 4a and 4b show on an enlarged scale the cavity according to the invention provided in the card, with and without cover foil, respectively.
Figure 4B:
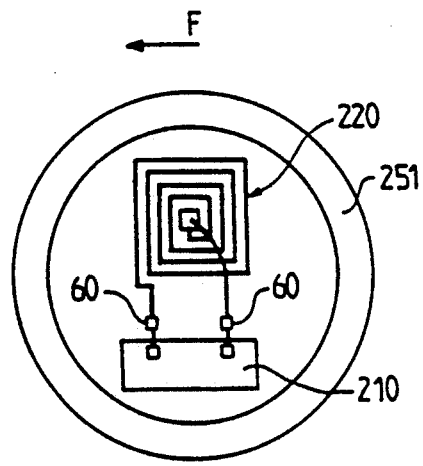

FIG. 4a shows the grooves 105 realized by machining and occupying a portion of the cover foil so as to leave the space open for the coil 220 (FIG. 2b). The coil 220 is preferably provided adjacent a transverse boundary of the cover foil. (The arrow F indicates the longitudinal direction of the card).

We claim:

1. A microcircuit card comprising a card support which has a cavity in which a cover foil is fixed, which foil has a circuit support and at least one circuit arranged on a lower surface of the circuit support facing towards the interior of the cavity, the circuit being provided opposite a first portion of a bottom of the cavity, characterized in that the circuit support comprises on its lower surface at least one energy transfer element arranged opposite a second portion of the bottom of the cavity remote from said first portion.

2. A card as claimed in claim 1, characterized in that the circuit support is a flexible printed circuit with the energy transfer element patterned thereon.

3. A card as claimed in claim 1, characterized in that at least one energy transfer element is a coil.

4. A card as claimed in claim 1 to 3, characterized in that the bottom comprises at least one thinned part situated at least substantially outside said first portion.

5. A card as claimed in claim 1, characterized in that the said second portion is arranged close to a lateral edge of the cavity.

6. A card as claimed in claim 1, characterized in that at least one part of the second portion of the bottom of the cavity has a region of increased thickness.

7. A card as claimed in claim 1, characterized in that said increased thickness is such that the energy transfer element is substantially in contact therewith.

* * * * *